US011811465B1

(12) United States Patent
Chen

(10) Patent No.: US 11,811,465 B1
(45) Date of Patent: Nov. 7, 2023

(54) DETECTION OF PASSIVE INTERMODULATION DISTORTION IN OPEN RADIO ACCESS NETWORK

(71) Applicant: VIAVI SOLUTIONS INC., San Jose, CA (US)

(72) Inventor: Wei Chen, Potomac, MD (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 4 days.

(21) Appl. No.: 17/722,928

(22) Filed: Apr. 18, 2022

(51) Int. Cl.
| H04B 7/06 | (2006.01) |
| H04W 72/04 | (2023.01) |
| H04B 17/318 | (2015.01) |
| H04B 17/40 | (2015.01) |
| H04W 16/22 | (2009.01) |
| G01R 23/20 | (2006.01) |

(52) U.S. Cl.
CPC ............. *H04B 17/40* (2015.01); *G01R 23/20* (2013.01); *H04W 16/22* (2013.01)

(58) Field of Classification Search
CPC .... H04B 17/40; H04B 17/0085; H04B 17/16; H04W 16/22; H04W 24/10; H04W 24/08; H04W 24/02; H04W 24/06; G01R 23/20
See application file for complete search history.

(56) References Cited

U.S. PATENT DOCUMENTS

| 10,476,589 | B2 | 11/2019 | Heath et al. | |
| 10,834,729 | B1 * | 11/2020 | Guri | H01Q 1/246 |
| 11,043,998 | B2 * | 6/2021 | Ahmed | H04W 72/04 |
| 2021/0409977 | A1 * | 12/2021 | Dussmann | H04W 28/0231 |

FOREIGN PATENT DOCUMENTS

| EP | 4138472 A1 * | 2/2023 | ......... H04L 5/0048 |
| WO | WO-2017112807 A1 * | 6/2017 | ............... H04B 7/04 |

OTHER PUBLICATIONS

"Cheng Zhang et al., Routing and Packet Scheduling For Virtualized Disaggregate Functions in 5G O-RAN Fronthaul, 2021, IEEE Global Communication Conference (BLOBECOM), pp. 1-6" (Year: 2021).*
"Daniel Dik et al., Transport Security Considerations for the Open-RAN Fronthaul, 2021, IEEE 4th 5G World Forum (5GWF), pp. 253-258" (Year: 2021).*

* cited by examiner

*Primary Examiner* — Rasheed Gidado
(74) *Attorney, Agent, or Firm* — Mannava & Kang, P.C.

(57) ABSTRACT

A test device can be used with an Open Radio Access Network (O-RAN) fronthaul and to test an uplink communication channel. The test device determines an uplink communication channel for passive intermodulation distortion (PIM) testing. The test device generates and transmits control plane (C-plane) messages to request the future RBs from an O-RAN radio unit (O-RU) installed at a cell site according to a delay time period. The test device receives user plane (U-Plane) messages from the O-RU containing data for the future RBs, and determines whether PIM is detected.

20 Claims, 6 Drawing Sheets

FIG. 5

DETECTION OF PASSIVE INTERMODULATION DISTORTION IN OPEN RADIO ACCESS NETWORK

BACKGROUND

A cell site, also known as a cell tower or cellular base station, includes an antenna and electronic communications equipment to support cellular mobile device communication. The antenna and equipment are typically placed in connection with a radio mast or tower, and the equipment generally connects cell site air interfaces to wireline networks, which may be comprised of fiber optic cables and coaxial cables. Cellular mobile devices communicating with a single cell tower generally constitute a local subnetwork, while the connection between the cell tower and the rest of the world may be referred to as a backhaul link or simply backhaul. A backhaul may include wired, fiber optic and wireless components, such as microwave transmission equipment. In conventional 3G and 4G architectures, fronthaul is associated with a Radio Access Network (RAN) architecture including centralized Base Band Units (BBUs), i.e., baseband controllers, and standalone Remote Radio Heads (RRHs) installed at remote cell sites. These BBU and RRH functional blocks, as well as the equipment that performs these functions, are located further away from each other than in prior mobile backhaul models. In some instances, the RRH and BBU are at the same location. In other instances, the RRH is located at the cell site, whereas the BBU is located in a centralized and protected location where it serves multiple RRHs. The optical links that interconnect the BBU and the multiple RRHs are referred to as fronthaul. The fronthaul includes interfaces between the RRH and the BBU. The backhaul includes interfaces between the BBU and the Evolved Packet Core (EPC). The BBU performs signal processing functions including converting layer 1 communications to layer 3 and vice versa for transmitting data to and from the EPC. A key challenge of the traditional RAN architecture which may be used for 3G or 4G services has to do with limitations regarding scaling and flexibility of deployment, optimization, management and orchestration of the network. Delivering 5G services often requires high-bandwidth, low latency, and signal processing flexibility that may not be possible with the traditional RAN architecture. Also, in the traditional RAN architecture, proprietary hardware and design with no multi-vendor interoperability are often used for fronthaul associated hardware and software. As a result, it is often difficult to install and test RRHs in the traditional RAN architecture.

To overcome the deficiencies of the traditional RAN, operators are moving to a dis-aggregated approach for signal processing hardware and software and to open, interoperable interfaces that are multi-vendor interoperable. To achieve the above-mentioned goals of an open radio access network, operators founded the Open RAN (O-RAN) Alliance (www.o-ran.org) to clearly define requirements and help build a supply chain eco-system that can foster an environment for existing and new vendors to drive innovation. As per the charter of the O-RAN Alliance, O-RAN Alliance members and contributors have committed to evolving radio access networks around the world. In an O-RAN architecture, RANs will be built on a foundation of virtualized network elements, white-box hardware and standardized interfaces that fully embrace O-RAN's core principles of intelligence and openness.

An O-RAN architecture includes cell towers, O-RAN radio units (O-RUs) which may be located at the cell towers, and decentralized processing units including an O-RAN distributed unit (O-DU) and an O-RAN central unit (O-CU), and a RAN Intelligent Controller (RIC). The O-RUs host a low physical (low-PHY) layer and radio frequency (RF) processing based on a lower layer functional split. This is similar to 3G RRH but further including the low-PHY layer. The O-DU handles a high-PHY layer and media access control (MAC) and radio link control (RLC) layers with network function virtualization (NFV) or containers. The RIC is a logical function that enables near-real-time control and optimization of O-RAN elements and resources via fine-grained data collection and actions. The RIC may also include a logical function that enables non-real-time control and optimization of RAN elements and resources, artificial intelligence/machine learning workflow including model training and updates, and policy-based guidance of applications and features.

Field technicians responsible for 5G O-RAN installations currently do not have the capability to automatically test O-RAN radio unit (O-RU) installations. Often, they have to rely on personal expertise to try to properly test and verify the installation of O-RUs and antennas. This can result in long durations for installation and testing of O-RUs due to the complexity of relying on expertise of technicians, poor test coverage of existing instruments and use of multiple instruments to perform tests for O-RU installation.

BRIEF DESCRIPTION OF THE DRAWINGS

Features of the present disclosure are illustrated by way of examples shown in the following figures. In the following figures, like numerals indicate like elements, in which:

FIG. 5 illustrates structure of a control plane message, according to an example of the present disclosure.

DETAILED DESCRIPTION

Figure 1:
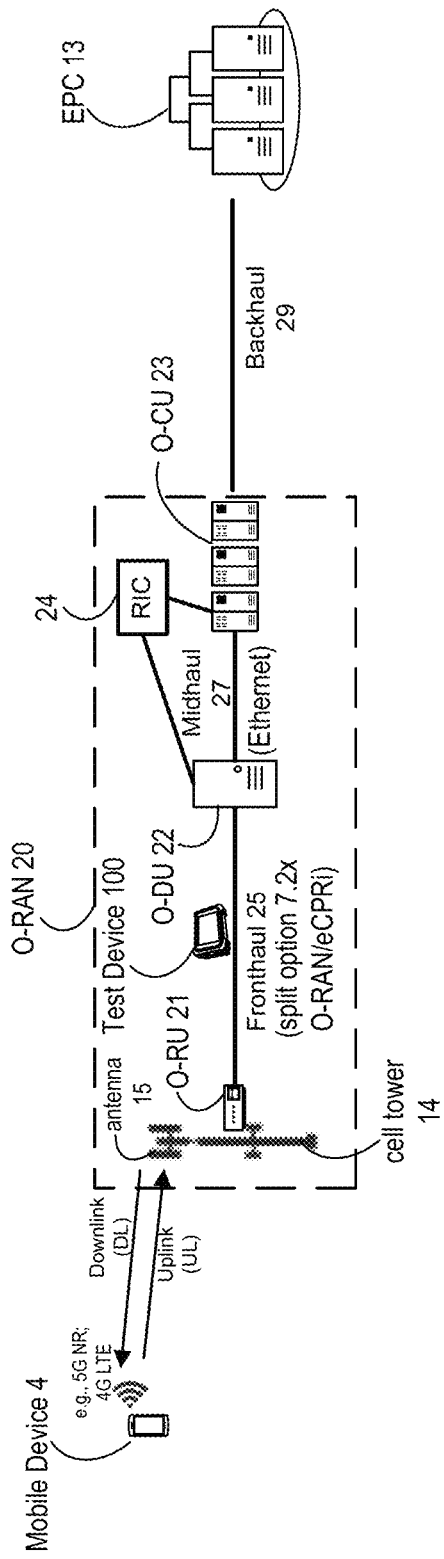
FIG. 1 illustrates an O-RAN architecture, including a test device, according to an example of the present disclosure.

For simplicity and illustrative purposes, the present disclosure is described by referring mainly to examples thereof. In the following description, details are set forth in order to provide an understanding of the present disclosure. It will be readily apparent however, that the present disclosure may be practiced without limitation to these details. In other instances, some methods and structures have not been described in detail so as not to unnecessarily obscure the present disclosure.

Throughout the present disclosure, the terms "a" and "an" are intended to be at least one of a particular element. As used herein, the term "includes" means includes but not limited to, the term "including" means including but not limited to. The term "based on" means based at least in part on.

To overcome the deficiencies of the traditional RAN, operators are moving to the O-RAN architecture which provides a disaggregated approach for signal processing hardware and software and open, interoperable interfaces that are multi-vendor interoperable. According to an example of the present disclosure, a test device is operable to test an uplink communication channel of a cellular network remotely via a fronthaul in an O-RAN radio access network, and in particular to perform spectrum analysis and passive intermodulation (PIM) detection for the uplink communication channel. PIM represents intermodulation products generated when two or more signals transit through a passive device with nonlinear properties. PIM is commonly caused by loose cable connections, dirty connectors, poor performance duplexers, aged antennas, etc. PIM can create interference and reduce receiver sensitivity, and may even inhibit communication completely. Thus, PIM can be a significant issue at cell sites and can be difficult to troubleshoot.

The test device can emulate an O-DU to obtain spectrum data for PIM detection in an uplink communication channel, according to an example of the present disclosure. For example, the test device includes an optical interface, e.g., a small form-factor pluggable (SFP) port, connectable to a fiber optic cable in the fronthaul. In an example, the fiber optical cable may be used for the fronthaul to connect an O-RU installed at a cell site to an O-DU. The test device emulates the O-DU to obtain the spectrum data, which can be used to detect PIM across a full spectrum or a subset of a full spectrum.

According to an example, to emulate the O-DU to obtain the spectrum data for the uplink communication channel, the test device executes messaging with the O-RU according to the O-RAN fronthaul split option 7.2x specification (herein referred to as the split option 7.2x) which is defined and published by the ORAN Alliance at www.o-ran.org. Split option 7.2x specifies an eCPRI-based open interface between the O-RU and the O-DU that enables use of packet-based transport and allows RAN payloads to be carried over Ethernet in the fronthaul. eCPRI stands for Enhanced Common Public Radio Interface as opposed to CPRI which stands for Common Public Radio Interface. CPRI and eCIPRI are standardized fronthaul communication interfaces. CPRI is commonly used for communication in legacy systems between a BBU and a RRH, and is synchronous. eCIPRI is a packetized asynchronous communication interface that is used in the fronthaul for O-RAN. In addition to using an eCIPRI-based open interface, split option 7.2x defines the lower layer split (LLS) between the O-RU, referred to as low PHY, and the O-DU, referred to as high PHY, for layer 1 (L1) processing, which is further discussed below. The split option 7.2x specifies the low PHY functions that are performed by the O-RU for uplink and downlink processing and also specifies the high PHY functions performed by the O-DU.

The test device can analyze the spectrum data to detect PIM and can provide graphical user interfaces on a display to show results for PIM detection and to provide instructions for remediating detected PIM. In an example, the test device can be embodied in a single, battery powered portable instrument that can be carried to cell sites for field testing, and may include interfaces, such as WIFI or other interfaces, to connect to remote devices and computers as needed.

FIG. 1 shows O-RAN 20 including cell tower 14, O-RU 21, and decentralized processing performed by O-DU 22, O-CU 23 and RIC 24. The O-RU 21, O-DU 22, O-CU 23 and RIC 24 are logical nodes, and their functions are performed by underlying physical equipment. The O-RAN 20 is comprised of a network of radio base stations and radios situated between mobile terminals and a core network, and that complies with the O-RAN specification published by the O-RAN alliance at www.o-ran.org. The functions performed by each of these O-RAN elements are described in the O-RAN specification.

The O-RU 21 is at the edge of O-RAN 20 and performs edge processing between the mobile device 4 (e.g., cellular phone, tablet with cellular interface, etc.) and the O-DU 22. The O-DU 22, O-CU 23 and RIC 24 are in the middle and perform signal processing for communication between the EPC 13 and O-RU 21. The O-RU 21 hosts the low-PHY layer and performs RF processing based on a lower layer functional split. This is similar to a 3G RRH but includes the low-PHY layer. The O-DU 22 hosts the high-PHY layer, and the MAC and RLC layer with network function virtualization or containers. The RIC 24 is a logical function that enables near-real-time control and optimization of O-RAN elements and resources via data collection and actions. The RIC 24 may also include a logical function that enables non-real-time control and optimization of RAN elements and resources, artificial intelligence/machine learning workflow including model training and updates, and policy-based guidance of applications and features. The processor intensive functionality is performed by the O-CU 23 which includes hosting the Radio Resource Control Protocol, the Service Data Adaptation Protocol and the Packet Data Convergence Protocol, and associated control planes.

The processing performed by O-CU 23 and RIC 24 may be performed by servers and other telecommunications equipment as is known in the art. Radios and other communications processing equipment may perform the processing of O-RU 21, and base station equipment, including signal processing equipment, may perform the processing of the O-DU 22. The O-RU 21 may be located at or near the cellular tower 14 and is connected to the antennas of the cellular tower 14. The O-DU 22 may be located at some distance away from the O-RU 21, by way of example, less than 1 mile to 10 miles. Although not shown, the O-DU 22 may be connected to multiple O-RUs.

The fronthaul 25 is a circuit between a baseband processing section of base station equipment and radio equipment. The fronthaul 25 may include fiber-based interfaces and dedicated fibers between the O-RU 21 and the O-DU 22. The midhaul 27 includes interfaces and communication lines between the O-DU 22, the O-CU 23 and RIC 24. The backhaul 29 includes interfaces and communication lines between the O-CU 23 and EPC 13.

The uplink and downlink directions are shown for communication to and from the mobile device 4 and the cell tower 14. Uplink signals are transmitted from the mobile device 4 to an antenna 15 of cell tower 14 on an uplink communication channel, and then transmitted via fronthaul 25 towards EPC 13. Downlink signals from EPC 13 are received at cell tower 14 via fronthaul 25 and transmitted from the cell tower 14 to mobile device 4.

Figure 2A:
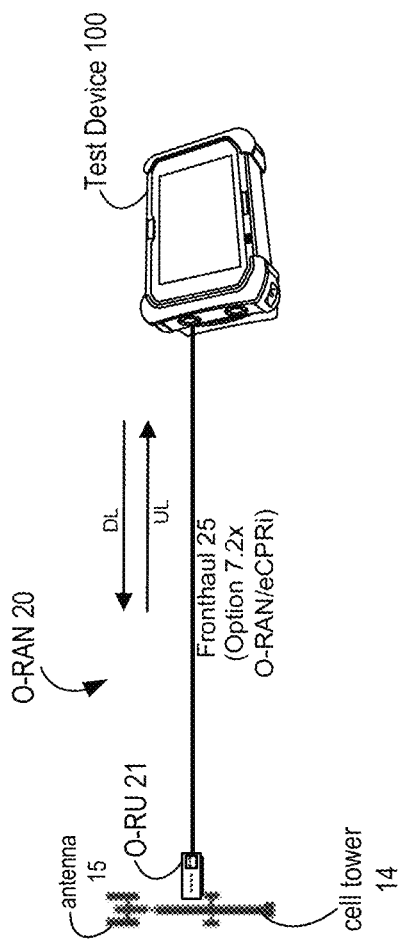
FIGS. 2A-B illustrate the test device connected to a fronthaul and an O-RU for testing, according to examples of the present disclosure.

FIG. 1 also shows test device 100 that is connectable to the fronthaul 25 and can emulate the O-DU 22 to run tests, including PIM detection in the uplink signals. In particular, FIG. 2A shows the test device 100 connected to the fronthaul 25 of O-RAN 20 and is operable to emulate the O-DU 22 for testing. For example, the test device 100 can connect to a fiber optic cable of the fronthaul 25. In an example, the fiber optic cable is typically connected to the O-RU 21. The fiber optic cable may be disconnected from the O-RU 21 and connected to the test device 100 to run tests including PIM detection. The test device 100 may be used for testing during installation of the O-RU 21, or may be used at other times, such as after installation, for example, such as for PIM detection and other testing. The test device 100 can test multiple radio technology types, referred to as technologies, including but not limited to 3GPP 4G LTE and 5G New Radio (NR).

Figure 2B:
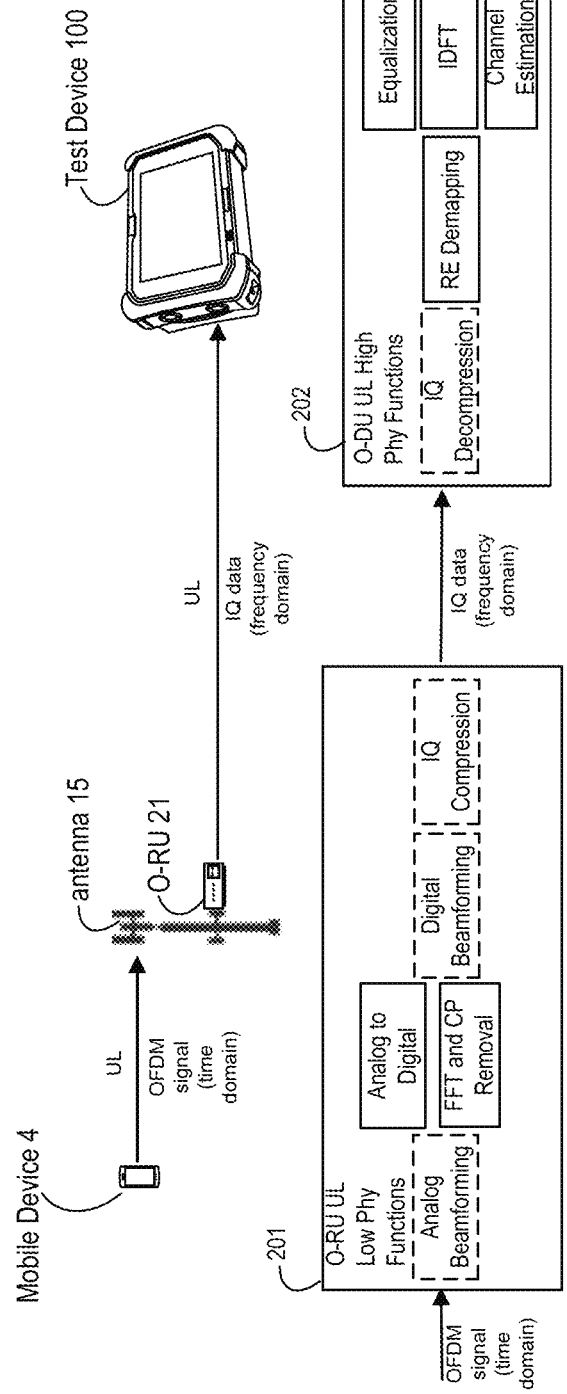

Similar to FIG. 2A, FIG. 2B shows the test device 100 connected to the fronthaul 25 of O-RAN 20 for testing. FIG. 2B further shows uplink processing according to split option 7.2x.

Split option 7.2x defines the lower layer split (LLS) between the O-RU, referred to as low PHY, and the O-DU, referred to as high PHY, for layer 1 (L1) processing. In the uplink direction, according to split option 7.2x, the O-RU 21 receives an uplink signal transmitted from a user device, such as mobile device 4 via antenna 15 of cellular tower 14. For example, mobile device 4 encodes user data, such as a bit sequence, for transmission according to orthogonal frequency division multiplexing (OFDM) on an uplink communication channel, e.g., a 4G or 5G uplink communication channel. The OFDM signals are received at the O-RU 21 via the antenna 15 and are processed according to split option 7.2x as is discussed below.

To be compliant with the split option 7.2x, the O-RU and the O-DU are required to perform particular functions. Required functions according to split option 7.2x for processing in the uplink direction are shown at 201-202 for the O-RU and the O-DU, respectively. Boxes shown in dashed lines represent optional functions.

An OFDM uplink signal from mobile device 4 is received at O-RU 21 via antenna 15. The OFDM uplink signal is in the time domain. The received OFDM uplink signal is converted to a digital signal, and fast Fourier transform (FFT) processing is applied to the digital signal to generate In-Phase/Quadrature (IQ) data of the sampled OFDM signal in the frequency domain. The IQ data includes an IQ sample sequence of the OFDM signal in the frequency domain for each Multiple In, Multiple Out (MIMO) spatial stream. Physical Random Access Channel (PRACH) filtering including Cyclic Prefix (CP) removal is performed to remove CPs from OFDM symbols in the OFDM uplink signal. Optional beam forming may be performed where analog beam performing is performed before FFT processing or digital beam forming is performed after FFT processing. Optional IQ compression may be performed before transmitting the IQ data via fronthaul 25 to the test device 100. The IQ data is transmitted in an eCPRi packet-based message format via fronthaul 25, e.g., Ethernet frames, to the test device 100.

The test device 100 emulates an O-DU and performs the O-DU uplink high PHY functions 202 on the received IQ data. IQ decompression may be performed if the IQ data was compressed by the O-RU 21 before transmission. Functions 202 required by split option 7.2x include resource element (RE) demapping. RE demapping extracts IQ data from an IQ signal mapped to time/frequency resources in LTE and NR. A resource element is one 15 kHz subcarrier by one symbol. Resource elements are aggregated into resource blocks. A resource block has dimensions of subcarriers by symbols. Twelve consecutive subcarriers in the frequency domain and six or seven symbols in the time domain form each resource block. After RE demapping, equalizer processing, inverse discrete Fourier transform (IDFT) processing, and channel estimation are performed. Then, demodulation, descrambling, and decoded are performed to determine the bit sequence originally transmitted from the mobile device 4.

The test device 100 analyzes the IQ data to determine spectrum data for the uplink signal. The test device 100 analyzes the spectrum data to determine if PIM exists.

In additional to the functional split discussed above, the O-RAN fronthaul specification defines planes of operations that specify messaging for different operations. For example, split option 7.2x defines control plane (C-Plane), user plane (U-Plane), synchronization plane (S-Plane) and management plane (M-Plane). The M-Plane specifies management plane messages used to manage the radio unit and provide O-RU management functions to set parameters on the O-RU side as required by the C/U-Plane and S-Plane. The C-Plane specifies control plane messages and commands for scheduling, beam-forming, down link precoding configuration, etc. The U-Plane specifies user plane messages for efficient data transfer within the strict time limits of 5G applications, and includes information for data compression, IQ data transfer and downlink precoding. The S plane plays the role of synchronizing two nodes for time, phase, and frequency. The S-Plane specifies messages for timing and synchronization aspects between the O-DU and the O-RU, including synchronizing the O-RU with a grandmaster clock available to the O-DU. To emulate the O-DU to test the O-RU 21, the test device 100 uses messaging, signaling formats and protocols specified for the O-DU for each of the planes discussed above. Also, through S-plane messaging, the O-DU and O-RU perform frequency synchronization such as for frequency division duplex. The O-RAN specification specifies constraints for synchronization between the O-RU and the O-DU in the fronthaul.

Figure 3:
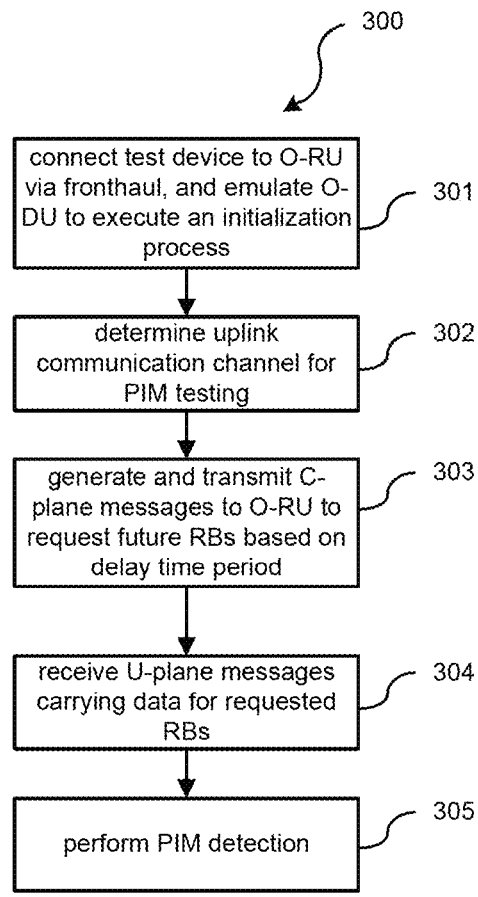
FIG. 3 illustrates a flow chart of a method, according to an example of the present disclosure.

FIG. 3 shows a flowchart of a method 300 for testing an uplink communication channel, including PIM detection, according to an example of the present disclosure. The test device 100 can perform the method 300. The method 300 is described by way of example based on FIGS. 1 and 2.

At 301, the test device 100 is connected to the O-RU 21 via fronthaul and emulates an O-DU to execute an initialization process with the O-RU. In an example, the test device 100 is connected to fronthaul 25 via an optical interface of the test device 100 to communicate with O-RU 21. The test device 100 executes an initialization process when initially communicating with the O-RU 21, emulating an O-DU initially connecting to the O-RU 21. During the initialization process, the test device 100 can specify the establishment of the M-Plane between the O-RU 21 and a NETCONF client in the test device 100, including exchanging transport layer addresses. Also, the NETCONF client in the test device 100 can set or determine O-RU parameters and get equipment status information via the M-Plane. In an example, after the test device 100 is connected to the fronthaul 25 such as shown in FIGS. 2A-B, the test device 100 is placed into O-DU emulation mode so the test device 100 operates as an O-DU to send commands to the O-RU 21 using the proper formats and protocols according to the M/S/C/U-Planes. Through M-plane messaging between the test device 100 and the O-RU 21, the test device 100 may determine the technologies used by the O-RU 21 and the channels for each technology. For cellular networks, some examples of technologies may include 4G LTE and 5G NR. The technology may also specify Dynamic Spectrum Sharing (DSS), and whether frequency division duplex (FDD) or Time Division Duplex (TDD) is being used, such as LTE-FDD, LTE-TDD, NR, DSS-FDD, or DSS-TDD. An example of channel information may include the center frequency, e.g., 1 GHz, identified for LTE-FDD and DSS-FDD technologies, and the Synchronization Signal Block (SSB) frequency, e.g., 1 GHz, is identified for NR and DSS-FDD.

Also, the channel bandwidth, e.g., 20 MHz, is determined for LTE-FDD and DSS-FDD.

Also, through S-plane messaging, the test device 100 and the O-RU 21 synchronize to the same clock. For example, in the S-plane, signals are transmitted over the fronthaul 25 using PTP or SynchE for clock synchronization in the O-RAN. The test device 100 may emulate a PTP/SyncE grandmaster clock, and checks whether the O-RU 21 can synchronize with the master clock based on messages exchanged between the test device 100 and the O-RU 21. For example, the test device 100 tests whether the O-RU 21 can lock onto a 1 pulse per second (PPS) and Time of the Day (ToD) reference signals generated by the test device 100, and displays whether the O-RU 21 is able to synchronize its clock with the 1PPS and ToD reference signals generated by the test device 100.

At 302, the test device 100 determines an uplink communication channel for PIM testing, i.e., PIM detection. The uplink communication channel includes a technology and a channel, e.g., channel bandwidth and center frequency. The uplink communication channel may be determined through the initialization process and/or may be selected based on user input. For example, the test device 100 may display the technologies and channels determined from step 301 on a display of the test device 100. A user may select a technology and a channel for PIM detection. For example, the user selects LTE and a 1 GHz center frequency and a 20 MHz channel bandwidth for an uplink channel. The user can select the entire channel for PIM detection or a portion of the channel. In an example, if known to the user, the user may input the uplink communication channel for PIM testing into the test device 100 without the need for the test device 100 to determine and display the available channels for selection by the user.

At 303, the test device 100 generates and transmits C-plane messages to the O-RU 21 to request future resource blocks (RBs) for an uplink signal transmitted on the uplink channel determined at 302. PIM often poses a problem for uplink signals. For example, the IQ data for the uplink signal transmitted in the uplink communication channel contains the signal created by the mobile device 4 plus the effects of the fronthaul environment, which may include intermodulation distortion caused by components such as cables, connectors and antennas. To detect PIM in the uplink signal, the test device 100 analyzes the IQ data for the uplink signal. The IQ data is derived directly from the FFT of the OFDM symbols (hereinafter symbols) of the sampled uplink signal transmitted from mobile device 4.

As is further discussed below with respect to FIG. 4, the test device 100 generates and transmits C-plane messages based on a delay time period. The delay time period may be stored in the test device 100, and the test device 100 uses the delay time period to generate the C-plane messages requesting future RBs. A future RB in this context is an RB for an uplink signal to be transmitted in the uplink communication channel in a period of time in the future from a time a C-plane message is transmitted from the test device 100. The amount of time in the future is based on the delay time period. The future RB carries OFDM symbols for an uplink signal to be transmitted from the mobile device 4, and received at the antenna 15.

The delay time period accounts for network delay including transmission time of C-plane messages in the fronthaul 25 from the test device 100 to the O-RU 21, and also accounts for processing delay of the O-RU 21 to receive and process uplink signals for transmission to the test device 100. For example, O-RU 21 performs cyclic-prefix (CP) removal and FFT in the uplink direction according to split option 7.2x. The test device 100, emulating an O-DU, formulates C-plane messages to request symbols for future frames to accommodate for FFT processing time.

At 304, the test device 100 receives U-plane messages carrying data for the requested RBs from O-RU 21. For example, the U-plane messages contain IQ data for the requested RBs.

At 305, the test device 100 performs PIM detection based on the symbols in the requested RBs. For example, the test device 100 displays the real-time spectrum for the received symbols. The real-time spectrum may include signal level versus frequency and is periodically updated, e.g., every 100 ms. The test device 100 may also display a spectrogram which is history of the spectrum. The test may run continuously where the test device 100 continuously sends C-plane messages to request the symbols and receives U-plane messages with the requested symbols until a user stops the test or changes the configuration such as by selecting a new channel.

To detect PIM, the test device 100 checks for flatness in the spectrum or look for abnormal peaks overlaid with a wideband signal. The test device 100 can display an indicator identifying PIM on the spectrum. A threshold indicates narrow band peak over broadband signal to identify PIM. Using O-RAN C plane messages, an O-DU can configure any numbers of resource blocks to be used to transmit and/or to receive IQ data to and/or from an O-RU. Active PIM detection can be conducted in real-time using O-RAN U plane messages to transmit specially encoded CW waveform and then monitor the received IQ data from the O-RU for possible PIM.

In an example, to detect PIM, user equipment traffic is removed from the spectrum, and a traffic-free spectrum is obtained. The traffic free spectrum is compared to reference spectrums, or parametric descriptions of spectrums, which may be from a lookup table stored in memory. These can include spectrums that describe PIM. If a good match is found to a PIM reference spectrum, the test device can store this as a PIM event and provide an indication of the detected PIM. In an example, calculated slope of averaged traces are compared to a reference slope that describes PIM. If the slopes are sufficiently close, this is an indication that PIM is likely the problem.

The spectrum of PIM has a characteristic shape, making it identifiable by a trained observer, at least after some averaging is applied to the spectrum to remove variations. The spectrum shape for PIM can take on several similar forms depending on the relative frequencies of the signals causing the PIM. These forms are generally the slope of the spectrum, which can be rising or falling, over a range of known frequencies. All types of PIM have a similar characteristic, in that there is a significant slope to the spectrum after averaging the spectrum over time. If the slope is relatively large (positive or negative), this is an indication that PIM is present. This process is somewhat slower and less precise than comparing to a specific stored computed reference spectrum.

As discussed above with respect to step 303, the test device 100 generates C-plane messages to request future RBs based on a delay time period. The delay time period accounts for fronthaul transmission time and signal processing performed by the O-RU 21 to prepare and process uplink signals received via the antenna. For example, one purpose of an O-RU in general is to convert radio signals received at an antenna connected to the O-RU to a digital signal that can be transmitted over a packetized network. In particular, according to split option 7.2x, the O-RU L1 processing includes functions for In-Phase/Quadrature (IQ) modulation/demodulation, FFT and Inverse FFT, Physical Random Access Channel (PRACH) filtering as well as Cyclic Prefix (CP) addition and removal. Additionally, the O-RU packetizes symbols for the received uplink signals, and transmits the symbols in chunks, e.g., in packets, to an O-DU in U-plane messages. The test device 100 accounts for the time it takes to perform this processing when requesting symbols in uplink U-plane messages, as is further discussed below.

Figure 4:
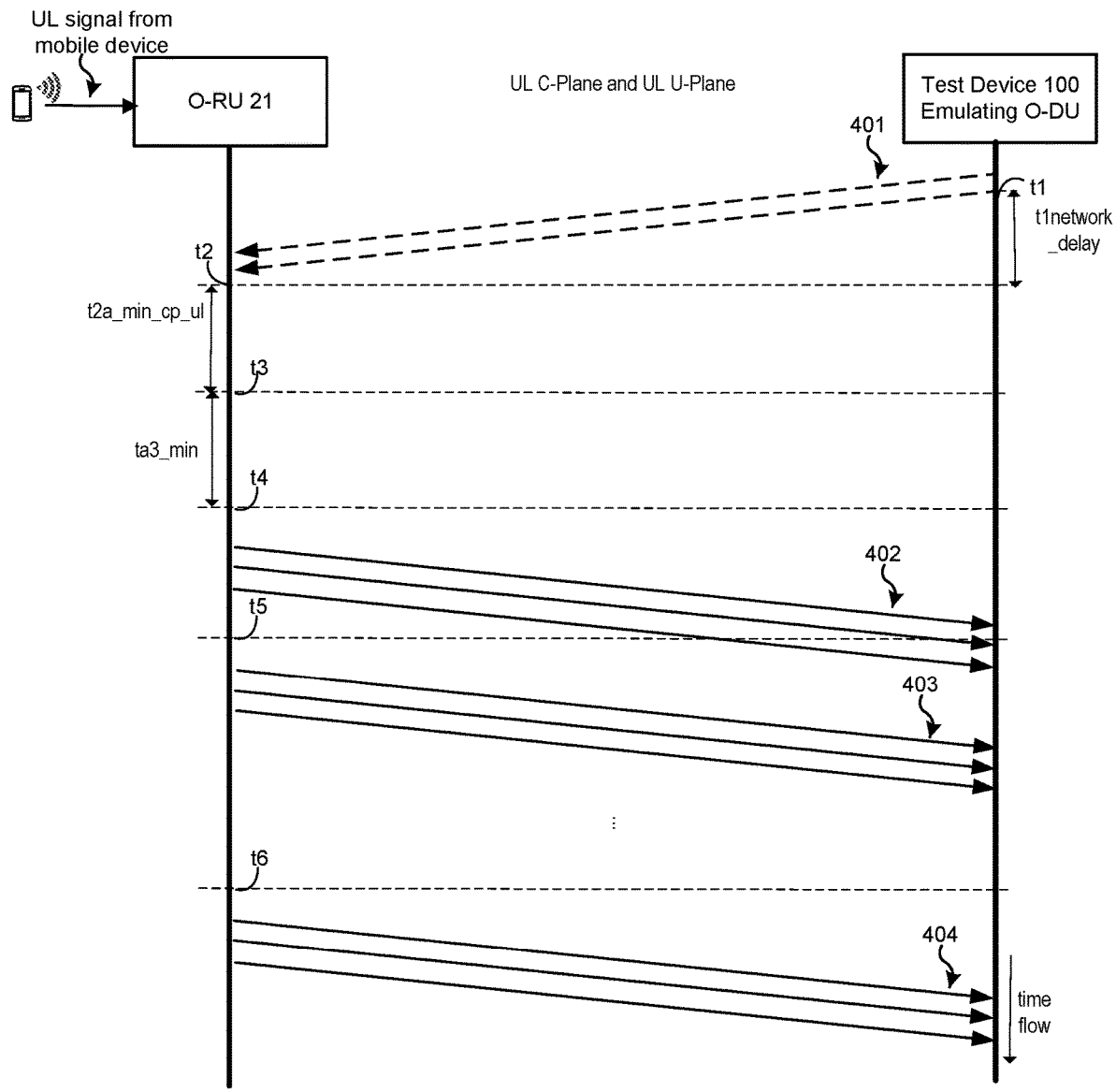
FIG. 4 illustrates message flow between the test device and the O-RU, according to an example of the present disclosure.

FIG. 4 shows a message flow between O-RU 21 and the test device 100 emulating an O-DU. The message flow facilitates the test device 100 to obtain symbols for uplink signals that can be analyzed to detect PIM and to perform spectrum analysis. The test device 100 generates C-plane messages to request symbols for uplink signals from the O-RU 21. The test device 100 uses O-RAN C-plane section type 1 messages to request the symbols for an uplink communication channel, such as the uplink communication channel determined at step 302 discussed above with respect to FIG. 3.

In an example, assume the user of the test device 100 selects a 20 MHz LTE uplink channel with a 1 GHz center frequency for PIM detection. The C-plane messages shown at 401 request symbols #M, M+1, . . . N for the entire 20 MHz channel by requesting future RBs carrying the symbols. An RB is the smallest unit of resources that can be allocated to a user. According to the LTE standard, a 20 MHz channel is comprised of 100 RBs. An LTE frame is 10 milliseconds (ms). A frame is comprised of ten 1 ms subframes. A slot is a unit consisting of symbols. A slot in the frame is 0.5 ms, so each subframe includes two slots. One slot has 7 symbols so each subframe has 14 symbols. An RB consists of one subframe and 12 subcarriers. An RB is 180 kHz wide in frequency and 1 symbol length in time. Thus, to receive one symbol for the 20 MHz channel, the C-plane messages request 100 RBs. If each C-plane message requests one symbol, then one hundred forty C-plane messages are transmitted from the test device 100 to O-RU 21 to request one 20 MHz bandwidth LTE frame. However, a single C-plane message may request multiple symbols and multiple RBs per symbol. For example, a single C-plane message with startPrbc=0 and numPrbc=100 per symbol may request seven symbols.

Figure 5:
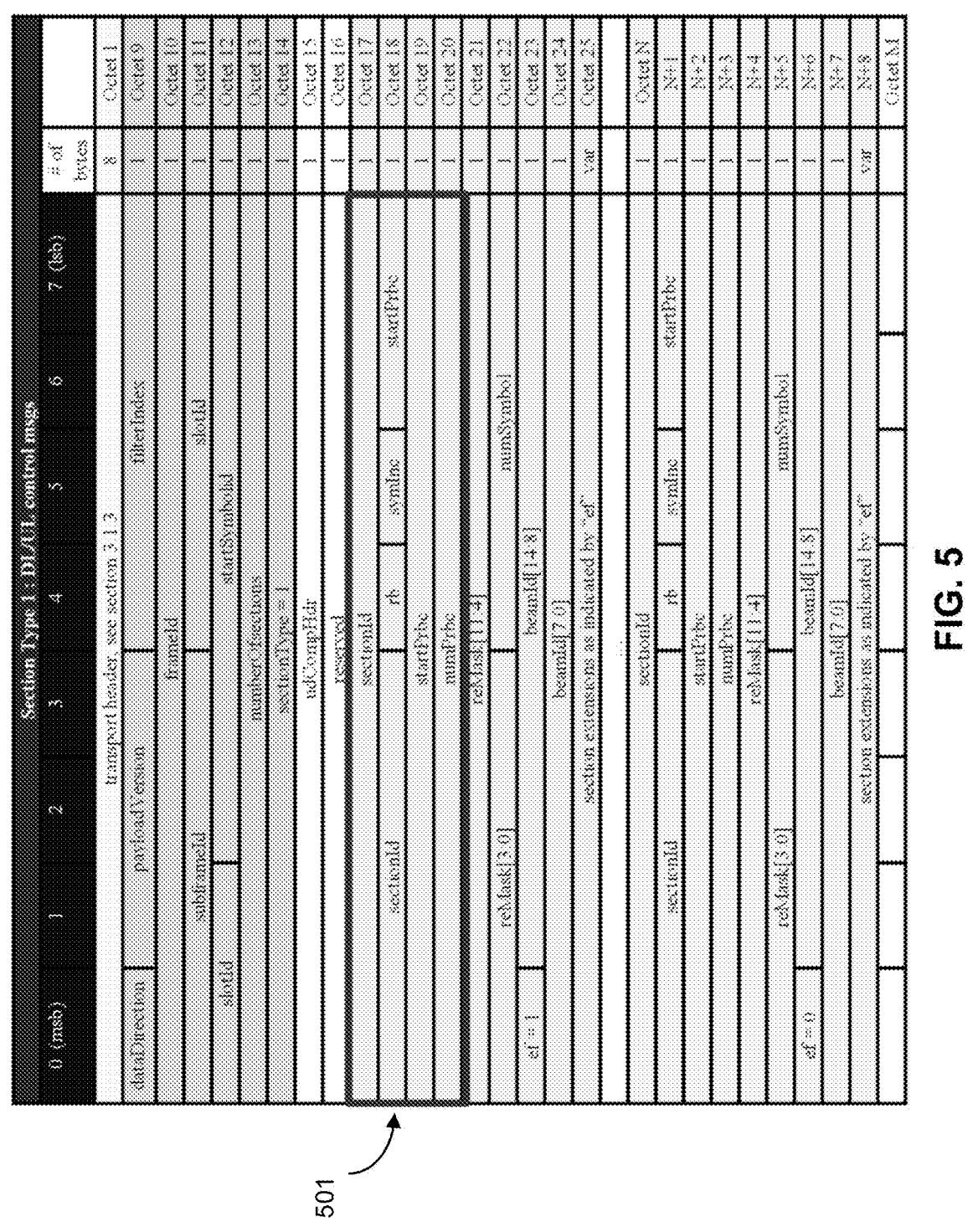

The C-plane messages for example are C-plane section type 1 messages defined in the O-RAN specification. The structure of a C-plane type 1 message is shown in FIG. 5. As stated in the O-RAN specification, C-Plane messages are encapsulated using a two-layered header approach. The first layer consists of an eCPRI standard header, including corresponding fields used to indicate the message type, while the second layer is an application layer including necessary fields for control and synchronization. Within the application layer, a "section" defines the characteristics of U-plane data to be transferred or received from a beam with one pattern id. In general, the transport header, application header, and sections are all intended to be aligned on 4-byte boundaries and are transmitted in "network byte order" meaning the most significant byte of a multi-byte parameter is transmitted first.

Section 501 shown in FIG. 5, referring to Octets 17-20, includes the variables for specifying the characteristics of U-plane data to be received by the test device 100. Section 501 includes physical resource block (PRB), start position (startPrbc), and number of PRBs (numPrbc). An O-RAN packet data payload contains a number of PRBs. Each PRB is built of 12 IQ samples.

For the test device 100 to generate the C-plane messages, the PRBs are selected for a time after the delay time period. As an example, for 20 MHz LTE UL, a C-plane message header contains the following fields: sectionId=1, rb=0, symInc=0, startPrbc=0, and numPrbc=100

The delay time period accounts for network delay including transmission time of C-plane messages in the fronthaul 25 from the test device 100 to the O-RU 21 and also accounts for processing delay of the O-RU 21 to receive and process uplink signals for transmission to the test device 100. The processing delay includes time for the O-RU 21 to perform FFT and CP removal. In C-RAN systems, which are commonly used in 2G and 3G legacy infrastructures, the RRH does not perform FFT and CP removal, but in O-RAN, the FFT and CP removal are required to be performed by the O-RU to be compliant with the ORAN specification. The processing delay determined by the test device 100 includes processing time by the O-RU 21 for performing FFT and CP removal and other operations mentioned above.

The network delay and the processing delay are illustrated in FIG. 4. The network delay for transmission of C-plane messages from the test device 100 to O-RU 21 is shown as t1network_delay. The corresponding deadline for the network delay is shown as t2 (the end of UL C-plane receive window for requesting symbol #M), where symbol #M represents a first requested future uplink symbol for the uplink communication channel.

The processing delay for the O-RU is shown as t2a_min_cp_ul which represents the amount of time for O-RU 21 to process uplink signals received at the antenna, such as signals from mobile device 4 or any device transmitting uplink signals to cell tower 14, for transmission to the test device 100 via fronthaul 25. The corresponding deadline is shown as t3 (the earliest air interface UL signal sample for symbol #M arrives at O-RU antenna). This deadline is the deadline the first C-plane message transmitted from the test device 100 requesting future symbol #M must arrive at O-RU 21 before the earliest air interface uplink signal sample of symbol #M, e.g., startSymbolId for symbol #M, arrives at an antenna of O-RU 21 from for example mobile device 4. Accordingly, the delay time period is such that a first future RB (e.g., containing symbol #M) of the future RBs is received at antenna 15 connected to O-RU 21 prior to O-RU 21 receiving a first C-plane message of the C-plane messages requesting the first future RB from test device 100.

The test device 100 generates and transmits the C-plane messages to meet the deadlines associated with t1network_delay and t2a_min_cp_ul. For example, assuming again the user of the test device 100 selects a 20 MHz LTE uplink channel for PIM detection, the test device 100 calculates the future time t3 that the first symbol M of the symbols M . . . N for the 20 MHz channel will be received at the antenna for O-RU 21. t3 is determined as a function of t1network_delay and t2a_min_cp_ul such that t3=t1+t1network_delay+t2a_min_cp_ul, where t1 is the transmission time of the first C-plane message requesting the symbols M . . . N. In other words, the delay time period is t1+t1network_delay+t2a_min_cp_ul. Once the time t3 is determined, the test device 100 determines the PRBs to request for the symbols M . . . N received at the antenna of O-RU 21 starting at time t3 and generates the C-plane messages and transmits the C-plane messages. In an example, network delay, namely t1network_delay, can be measured by an O-DU or the test device 100 emulating an O-DU using eCPRI defined One Way Delay Measurement message. The O-RU delay profile including ta3_min/max and t2a_min/max_cp_ul for UL can be determined by the test device 100 via the M-plane delay management YANG module. Once determined, the test device 100 stores t1 network delay, ta3_min/max and t2a_min/max_cp_ul, and can retrieve these values to formulate the C-plane messages.

If the deadlines discussed above are not met, then the O-RU 21 may not transmit the U-plane messages with the requested symbols to the test device 100. O-RU 21 may have little or no ability to cache the received symbols to accommodate subsequent requests for uplink signal symbols that have already been received at the antenna of O-RU 21, because the O-RUs are commonly designed to be low in cost and not have the caching capability. Accordingly, when the uplink signals are received they are continuously processed by an O-RU and transmitted to o-DUs for further transmission to the EPC, such as EPC 13 shown in FIG. 1. Thus, if the C-plane message from the test device 100 for symbol #M is received at O-RU 21 after time t3, i.e., after #M was received at the antenna of O-RU 21, O-RU 21 may no longer have symbol #M and cannot send symbol #M to the test device 100. Accordingly, to ensure the PIM test can be performed, the deadline for transmitting the C-plane message for symbol #M is adhered to by the test device 100.

Referring again to FIG. 4, at time t4 (i.e., the start of UL U-plane transmit window for symbol #M), after a period of time ta3_min for O-RU 21 to process the C-plane message, O-RU 21 starts transmitting U-plane messages to the test device 100 that include the requested symbols M . . . N. The U-plane messages are transmitted in packets to the test device 100 via fronthaul 25. The U-plane messages include the symbols instead of RBs. As shown, multiple U-plane messages are needed to transmit the symbols M . . . N. For example, 402 represents U-plane messages for symbol #M; 403 represents U-plane messages for symbol #M+1; and so on until 404 represents U-plane messages for symbol #N. Time t5 represents the start of UL U-plane transmit window for symbol #M+1; and so on until time t6 represents the start of UL U-plane transmit window for symbol N. The test device 100 receives and decodes the U-plane messages and extracts the symbols representing the spectrum.

The process may be repeated until the user stops the request or changes the request, such as via the user input interface of the test device 100. For example, the test device 100 displays the real-time spectrum for the received symbols. The real-time spectrum may include signal level versus frequency and is periodically updated based on the received symbols for the 20 MHz channel. The test device 100 may also display a spectrogram which is history of the spectrum. Also, the test device 100 performs PIM detection based on the spectrum. The test may run continuously until a user stops the test or changes the configuration such as by selecting a new channel.

Figure 6:
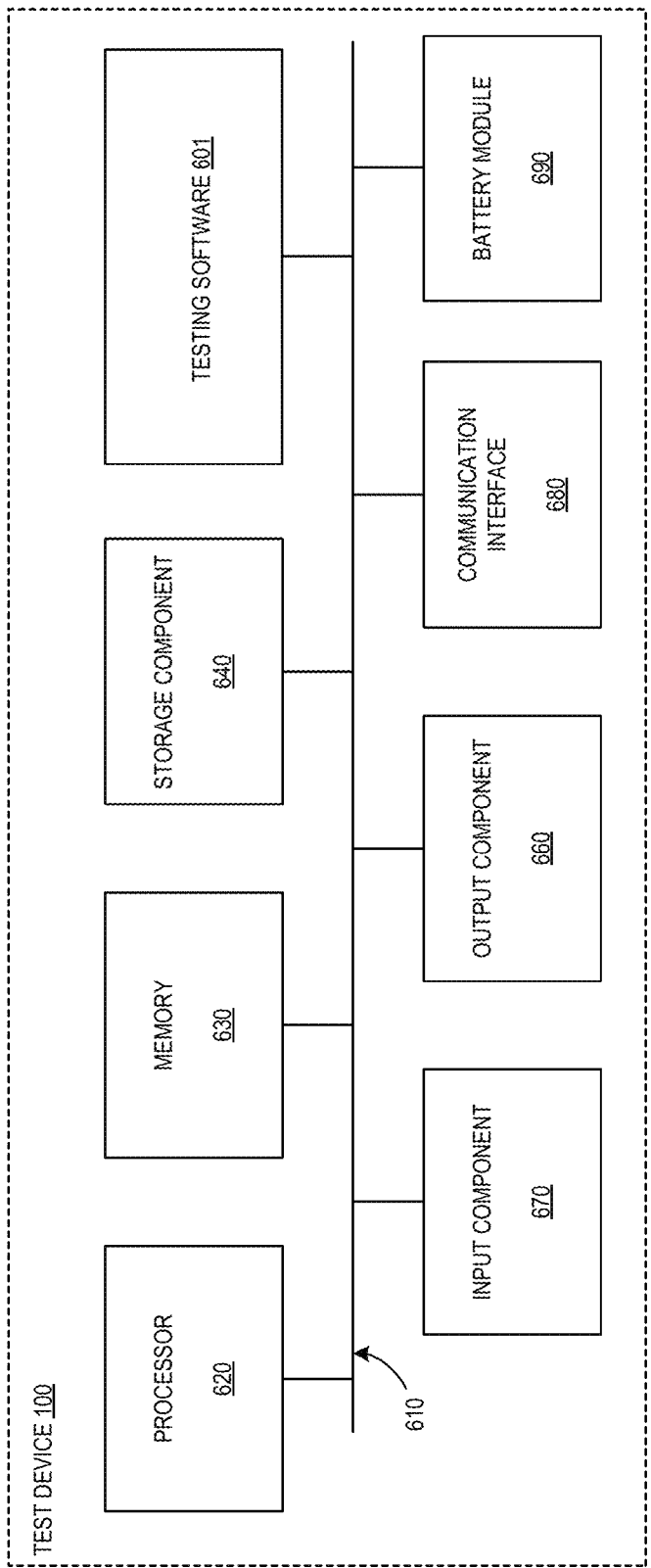
FIG. 6 illustrates a block diagram of the test device, according to an example of the present disclosure.

FIG. 6 is a diagram of components of test device 100, according to an example of the present disclosure. Test device 100 may include a bus 610, a processor 620, a memory 630, a storage component 640, an input component 670, an output component 660, a communication interface 680, battery module 690, and testing software 601 with an O-DU emulator. In an example, the testing software 601 may include machine readable instructions stored on a non-transitory storage medium, e.g., memory 630, and executed by a processor, such as processor 630.

The testing software 601 may perform the processes, operations and functions tests described above, including the method 300.

Bus 610 includes a component that permits communication among the components of test device 100. Processor 620 is implemented in hardware, firmware, or a combination of hardware and software. Processor 620 may include one or more of a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some examples, processor 620 includes one or more processors capable of being programmed to perform a function. Memory 630 may include one or more memories such as a random access memory (RAM), a read only memory (ROM), and/or another type of dynamic or static storage device (e.g., a flash memory, a magnetic memory, and/or an optical memory) that stores information and/or instructions for use by processor 620.

Storage component 640 stores information and/or software related to the operation and use of test device 100. For example, storage component 640 may include a hard disk (e.g., a magnetic disk, solid state disk, etc.) and/or another type of non-transitory computer-readable medium.

Input component 670 includes a component that permits test device 100 to receive information, such as via user input (e.g., a touch screen display, a keyboard, a keypad, a mouse, a button, a switch, and/or a microphone). Additionally, or alternatively, input component 670 may include a sensor for sensing information (e.g., a GPS component, an accelerometer, a gyroscope, and/or an actuator). Output component 660 includes a component that provides output information from test device 100 (e.g., a display, a speaker, a user interface, and/or one or more light-emitting diodes (LEDs)). Output component 660 may include a display providing a graphical user interface that can display spectrum information and PIM information. Input component 670 and output component 660 may be combined into a single component, such as a touch responsive display, also known as a touchscreen.

Communication interface 680 includes a transceiver-like component (e.g., a transceiver and/or a separate receiver and transmitter) that enables test device 100 to communicate with other devices, such as via a wired connection, a wireless connection, or a combination of wired and wireless connections. Communication interface 680 may permit test device 100 to receive information from another device and/or provide information to another device. For example, communication interface 680 may include an Ethernet interface, an optical interface, a coaxial interface, an infrared interface, an RF interface, a universal serial bus (USB) interface, a Wi-Fi interface, a cellular network interface, or the like. The test device 100 also includes ports, e.g., optical ports, for connecting to the fronthaul 25. The ports may include SFPs connectable to fibers.

Battery module 690 is connected along bus 610 to supply power to processor 620, memory 630, and internal components of test device 100. Battery module 690 may supply power during field measurements by test device 100. Battery module 690 permits test device 206 to be a portable integrated device for conducting field measurements of propagation delay in a RAN.

Test device 100 may perform one or more processes described herein. Test device 100 may perform these processes by processor 620 executing software instructions, e.g., testing software 601, stored by a non-transitory computer-readable medium, such as memory 630 and/or storage component 640. A computer-readable medium is defined herein as a non-transitory memory device. A memory device includes memory space within a single physical storage device or memory space spread across multiple physical storage devices.

Software instructions may be read into memory 630 and/or storage component 640 from another computer-readable medium or from another device via communication interface 680. When executed, software instructions stored in memory 630 and/or storage component 640 may instruct processor 620 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The test device 100 may include components other than shown. For example, the test device 100 may include a spectrum analyzer and power meter for performing tests described above with respect to FIG. 3. The number and arrangement of components shown in FIG. 6 are provided as an example. In practice, test device 100 may include additional components, fewer components, different components, or differently arranged components than those shown in FIG. 6. Additionally, or alternatively, a set of components (e.g., one or more components) of test device 100 may perform one or more functions described as being performed by another set of components of test device 100.

What is claimed is:

1. A test device for use with an Open Radio Access Network (O-RAN) fronthaul and to test an uplink communication channel, the test device comprising:
    a processor;
    a memory to store machine readable instructions executable by the processor;
    an input/output (I/O) device comprising a display;
    an optical interface connectable to a fiber optic cable in the fronthaul, the fiber optical cable connectable to an O-RAN radio unit (O-RU) installed at a cell site; and
    the processor is to execute the machine readable instructions to:
        determine an uplink communication channel for passive intermodulation distortion (PIM) testing;
        store a delay time period for requesting future resource blocks (RBs) received in the uplink communication channel at the O-RU,
        generate and transmit control plane (C-plane) messages via the optical interface to request the future RBs from the O-RU according to the delay time period so a first future RB of the future RBs is received at an antenna connected to the O-RU prior to the O-RU receiving a first C-plane message of the C-plane messages requesting the first future RB;
        receive, via the optical interface, user plane (U-Plane) messages from the O-RU containing data for the future RBs; and
        determine whether PIM is detected based on the data for the future RBs received in the U-plane messages.

2. The test device of claim 1, wherein the delay time period comprises an estimated network delay time period to transmit a C-plane message from the test device to the O-RU via the fronthaul and an estimated processing time period for the O-RU to process uplink signals received at the O-RU via the antenna on the uplink communication channel.

3. The test device of claim 2, wherein the estimated processing time period for the O-RU includes a time period for the O-RU to perform a plurality of operations, including cyclic prefix removal and fast Fourier transform of the received uplink signals.

4. The test device of claim 1, wherein the test device emulates an O-RAN radio unit distributed unit (O-DU) connected to the O-RU to generate and transmit control plane (C-plane) messages in compliance with O-RAN split option 7.2x.

5. The test device of claim 4, wherein to emulate the O-DU, the test device executes an initialization process using M-plane messages to establish a connection with the O-RU via the fronthaul.

6. The test device of claim 5, wherein the initialization process comprises at least one of frequency and time synchronizing the test device and the O-RU using S-plane messages, wherein the future RBs are identified in the C-plane messages based on the synchronization.

7. The test device of claim 1, wherein the data contained in the U-plane messages comprises inphase and quadrature (IQ) data for orthogonal frequency division multiplexing (OFDM) symbols for the future RBs.

8. The test device of claim 7, wherein the processor is to:
    determine a spectrum of an uplink signal in the uplink communication channel based on the IQ data; and
    display the spectrum on the display.

9. The test device of claim 8, wherein the processor is to:
    compare the spectrum to a reference spectrum to determine whether the uplink signal includes PIM; and
    display the compared spectrums on the display.

10. The test device of claim 1, wherein the uplink communication channel comprises a cellular network communication technology and a channel bandwidth.

11. The test device of claim 1, wherein the C-plane messages identify the future RBs by identifying physical resource blocks associated with the future RBs.

12. The test device of claim 1, wherein the test device is a portable, battery-operated unit connectable to the fronthaul for field testing.

13. The test device of claim 1, wherein the test device transmits the C-plane messages to the O-RU via packetized asynchronous communication using an enhanced common public radio interface.

14. A method of requesting resource blocks via an Open Radio Access Network (O-RAN) fronthaul for testing an uplink communication channel by a testing device, the method comprising:
    determining, based on a delay time period, future resource blocks (RBs) for an uplink signal to be received by an O-RAN radio unit (O-RU) on an uplink communication channel;
    generating and transmitting control plane (C-plane) messages via the fronthaul to the O-RU to request the future RBs from the O-RU so a first future RB of the future RBs is received at an antenna connected to the O-RU prior to the O-RU receiving a first C-plane message of the C-plane messages transmitted from the test device;
    receiving, via the fronthaul, user plane (U-Plane) messages from the O-RU containing data for the future RBs; and
    determining whether the uplink signal contains passive intermodulation distortion (PIM) based on the data for the future RBs received in the U-plane messages.

15. The method of claim 14, wherein the delay time period comprises an estimated network delay time period to transmit a C-plane message from the test device to the O-RU via the fronthaul and an estimated processing time period for the O-RU to process an uplink signal received at the O-RU via the antenna on the uplink communication channel.

16. The method of claim 15, wherein the estimated processing time period for the O-RU includes a time period for the O-RU to perform a plurality of operations in compliance with O-RAN split option 7.2x, including cyclic prefix removal and fast Fourier transforms.

17. The method of claim 16, wherein the data contained in the U-plane messages comprises inphase and quadrature (IQ) data for orthogonal frequency division multiplexing (OFDM) symbols of the future RBs.

18. The method of claim 17, comprising:
determining a spectrum of the uplink signal based on the IQ data; and
comparing the spectrum to a reference spectrum to determine whether the uplink signal includes PIM.

19. The method of claim 14, wherein the C-plane messages identify the future RBs by identifying physical resource blocks associated with the future RBs.

20. A portable test device for use with an Open Radio Access Network (O-RAN) fronthaul and to field test an uplink communication channel, the test device comprising:
a battery;
a processor;
a memory to store machine readable instructions executable by the processor to perform cell site testing;
an input/output (I/O) device comprising a display;
an optical interface connectable to a fiber optic cable in the fronthaul, the fiber optical cable connectable to an O-RAN radio unit (O-RU) installed at a cell site; and
the processor is to execute the machine readable instructions to:
determine, based on a delay time period, future resource blocks (RBs) for an uplink signal to be received by the O-RU on an uplink communication channel;
generate and transmit control plane (C-plane) messages via the fronthaul to the O-RU to request the future RBs from the O-RU so a first future RB of the future RBs is received at an antenna connected to the O-RU prior to the O-RU receiving a first C-plane message of the C-plane messages transmitted from the test device;
receive, via the fronthaul, user plane (U-Plane) messages from the O-RU containing data for the future RBs; and
determine whether the uplink signal contains passive intermodulation distortion (PIM) based on the data for the future RBs received in the U-plane messages.

* * * * *